(12) United States Patent
Peng et al.

(10) Patent No.: US 11,519,071 B2
(45) Date of Patent: Dec. 6, 2022

(54) METHOD FOR FABRICATING CHAMBER PARTS

(71) Applicant: Applied Materials, Inc., Santa Clara, CA (US)

(72) Inventors: Gang Grant Peng, Fremont, CA (US); David W. Groechel, Los Altos Hills, CA (US); Han Wang, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 150 days.

(21) Appl. No.: 16/778,642

(22) Filed: Jan. 31, 2020

(65) Prior Publication Data

US 2020/0255946 A1    Aug. 13, 2020

Related U.S. Application Data

(60) Provisional application No. 62/804,545, filed on Feb. 12, 2019.

(51) Int. Cl.
| | | |
|---|---|---|
| *C23C 16/00* | (2006.01) | |
| *C23C 16/56* | (2006.01) | |
| *H01J 37/34* | (2006.01) | |
| *C23C 16/40* | (2006.01) | |
| *H01J 37/32* | (2006.01) | |

(52) U.S. Cl.
CPC ............ *C23C 16/56* (2013.01); *C23C 16/405* (2013.01); *H01J 37/32495* (2013.01); *H01J 37/3426* (2013.01)

(58) Field of Classification Search
CPC ................................. C23C 16/00; H01J 37/00
See application file for complete search history.

(56) References Cited

U.S. PATENT DOCUMENTS

| | | | | |
|---|---|---|---|---|
| 5,473,138 A | * | 12/1995 | Singh | ...................... B29C 59/16 219/121.68 |
| 7,048,607 B1 | | 5/2006 | Wu et al. | |
| 8,016,948 B2 | * | 9/2011 | Wang | ........................ C23C 4/11 134/26 |

(Continued)

FOREIGN PATENT DOCUMENTS

| | | | |
|---|---|---|---|
| JP | H07183283 A | | 7/1995 |
| JP | 2010229492 A | * | 10/2010 |

(Continued)

OTHER PUBLICATIONS

JP-2010229492-A, Google Patent, (Year: 2010).*

(Continued)

*Primary Examiner* — David P Turocy
*Assistant Examiner* — Mohammad Mayy
(74) *Attorney, Agent, or Firm* — Patterson + Sheridan, LLP (57) ABSTRACT

One example of the disclosure provides a method of fabricating a chamber component with a coating comprising a yttrium containing material with desired film properties. In one example, the method of fabricating a coating material includes providing a base structure comprising an aluminum containing material. The method further includes forming a coating layer that includes a yttrium containing material on the base structure. The method also includes thermal treating the coating layer to form a treated coating layer.

20 Claims, 5 Drawing Sheets

(56) References Cited

U.S. PATENT DOCUMENTS

| | | | |
|---|---|---|---|
| 9,017,765 B2* | 4/2015 | Sun | C04B 41/86 |
| | | | 427/376.1 |
| 9,556,507 B2* | 1/2017 | Duan | C23C 4/11 |
| 2003/0029563 A1 | 2/2003 | Kaushal et al. | |
| 2006/0073354 A1* | 4/2006 | Watanabe | H01J 37/32495 |
| | | | 428/596 |
| 2007/0218302 A1* | 9/2007 | Kobayashi | C23C 4/18 |
| | | | 428/472 |
| 2008/0108225 A1* | 5/2008 | Sun | C23C 24/04 |
| | | | 438/758 |
| 2008/0223725 A1 | 9/2008 | Han et al. | |
| 2008/0308750 A1* | 12/2008 | Abeln | B23K 26/0624 |
| | | | 250/492.1 |
| 2012/0067618 A1* | 3/2012 | Kappertz | H01L 31/1888 |
| | | | 174/126.1 |
| 2016/0122584 A1 | 5/2016 | Buskens et al. | |
| 2019/0341276 A1 | 11/2019 | Chow et al. | |

FOREIGN PATENT DOCUMENTS

| | | | |
|---|---|---|---|
| KR | 20160127667 A | 11/2016 | |
| KR | 20170021103 A | 2/2017 | |
| WO | 2019203978 A1 | 10/2019 | |
| WO | 2019231609 A1 | 12/2019 | |

OTHER PUBLICATIONS

International Search Report and Written Opinion, International Patent Application PCT/US2020/014103 dated May 14, 2020 consists of 11 pages.

* cited by examiner

METHOD FOR FABRICATING CHAMBER PARTS

CROSS-REFERENCE TO RELATED APPLICATIONS

This application claims benefit of U.S. Provisional Application Ser. No. 62/804,545, filed Feb. 12, 2019, all of which are incorporated by reference in its entirety.

BACKGROUND

Field

Examples of the present disclosure generally relate to a method and apparatus for plasma processing and, more specifically, to a method and apparatus for plasma processing with component parts having enhanced film properties.

Description of the Related Art

The fabrication of microelectronics or integrated circuit devices typically involves a complicated process sequence requiring hundreds of individual steps performed on semiconductors, dielectric and conductive substrates. Examples of these process steps include oxidation, diffusion, ion implantation, thin film deposition, cleaning, etching and lithography. Plasma processes are often used for etching process and processing chamber cleaning process after thin film deposition processes. In chemical vapor deposition, reactive species are generated by applying voltages to suitable process gases, and subsequent chemical reactions result in the formation of a thin film on a substrate. In plasma etching, a previously deposited film is exposed to the reactive species in a plasma, often through a patterned mask layer formed in a prior lithography step. Reactions between the reactive species and the deposited film result in the removal, or etching, of the deposited film.

When chamber parts or process kits are exposed to the plasma environment for extended periods, chamber surface deterioration may occur due to reaction with the plasma species. For example, existing process kits or chamber component parts are often made of aluminum containing materials, such as aluminum oxide, aluminum alloys, aluminum oxynitride or aluminum nitride. Halogen-containing gases, e.g., fluorine- or chlorine-containing gases, are used in etching various material layers during circuit fabrication. It is believed that aluminum containing materials are vulnerable to attack by fluorine species, resulting in the formation of $Al_xF_yO_z$ on the surface of component parts. Such etch by-product may come off as particles during processing, resulting in contamination and defects on the substrate during processing. Furthermore, some aluminum containing parts seem to be susceptible to breakage, probably as a result of mechanical stress created during machining and cyclic exposure to temperature cycles and plasma. For chemical vapor deposition process, the metal halogen containing compounds often used as the precursors for deposition. These chemicals will decompose to yield halogen gas species or molecules, which often strongly corrode the chamber surface, especially the aluminum parts forming undesired $Al_xF_yO_z$ side products. The cleanliness of the chamber surface is one of the crucial factors that would influence the deposition performance. The chamber surface cleanliness also depends on the chamber surface roughness. It is believed that a rougher chamber component surface may likely generate more particles during a deposition process.

Thus, there is a need for a chamber part that has a reliable surface material for plasma applications, and for improved processes for fabricating such part.

SUMMARY

One example of the disclosure provides a method of fabricating a chamber component with a coating comprising yttrium containing material with desired film properties. In one example, the method of fabricating a coating material includes providing a base structure comprising an aluminum containing material. The method further includes forming a coating layer that includes a yttrium containing material on the base structure. The method also includes thermal treating the coating layer to form a treated coating layer.

In another example, the method of fabricating a coating material, includes providing a base structure comprising an aluminum containing material. A coating layer is formed. The coating layer includes a yttrium containing material on the base structure. The method further includes laser treating the coating layer to form a treated coating layer.

In yet another example, a chamber component includes a laser treated coating layer. The laser treated coating layer includes a yttrium containing material on a chamber component. The laser treated coating layer has a film density greater than 4.0 g/cm$^3$.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, where possible, to designate identical elements that are common to the figures. It is contemplated that elements and features of one example may be beneficially incorporated in other examples without further recitation.

It is to be noted, however, that the appended drawings illustrate only exemplary examples of this disclosure and are therefore not to be considered limiting of its scope, for the disclosure may admit to other equally effective examples.

DETAILED DESCRIPTION

The present disclosure provides a method and an apparatus for fabricating plasma processing chamber parts with a coating with improved characteristics such as enhanced chemical or plasma resistance. In one example, the coating material may comprise a yttrium containing material with enhanced film characteristics. Such enhanced characteristics are obtained when the coating layer disposed on the part is subjected to a high temperature treatment process after at least a portion of the coating material is formed on the part. In one example, the coating may be formed on a part followed by a high temperature treatment process, such as a laser treatment process, or other energy treatment process.

Figure 1:
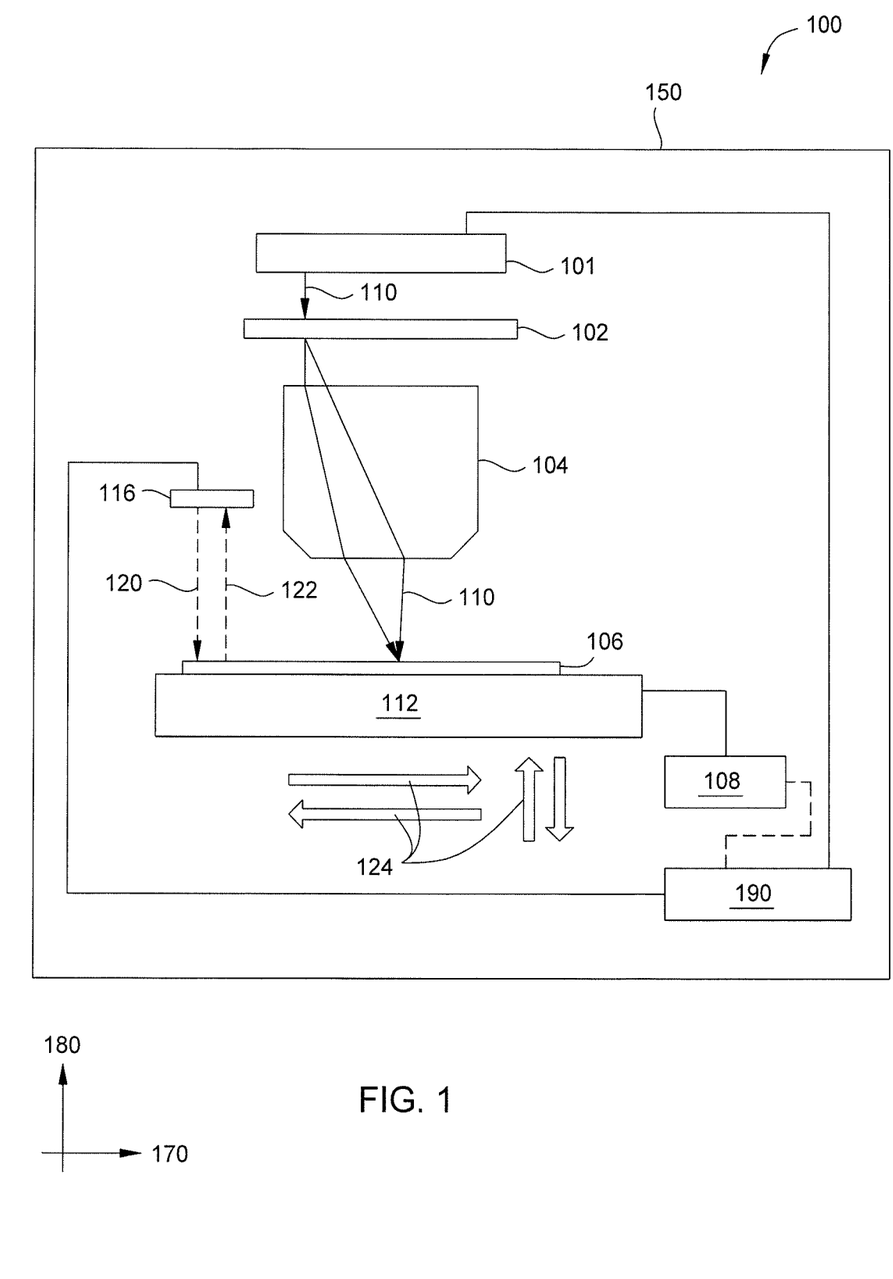
FIG. 1 is a processing tool that may be utilized to form a coating on a chamber component.

FIG. 1 depicts a processing tool 100 that may be utilized to treat a coating material formed on a surface of a substrate, such as a part utilized in a plasma processing chamber. The processing tool 100 may be a laser energy apparatus that directs laser energy to the coating material formed on the substrate. Alternatively, the processing tool 100 may be any suitable energy providing apparatus that may provide thermal energy, beam energy, light energy, or other suitable energy to alter the bonding structure or film properties of the coating material disposed on the substrate.

The processing tool 100 has an enclosure 150 having a laser module 152, a stage 112 configured to support a substrate, such as the substrate 106, a translation mechanism 124 configured to control the movement of the stage 112. An actuator system 108 may also be coupled to the stage 112 to assist control and movement of the stage 112. It is noted that the substrate 106 here is a part that will be later utilized as a chamber component in a plasma reactor.

The laser module 152 includes a laser radiation source 101, at least one lens 102 and an optical focusing module 104 disposed above the stage 112. In one example, the laser radiation source 101 may be a light source made from Nd:YAG, Nd:YVO$_4$, crystalline disk, diode pumped fiber and other light source that can provide and emit a pulsed or continuous wave of radiation at a wavelength between about 187 nm and about 10,000 nm, such as between about 248 nm and 2,100 nm. In another example, the laser radiation source 101 may include multiple laser diodes, each of which produce uniform and spatially coherent light at the same wavelength. In yet another example, the power of the cumulative laser diode(s) is in the range of about 2 Watts to 200 Watts.

The focusing optical module 104 transforms the radiation emitted by the laser radiation source 101 using at least one lens 102 into a line, spot, or other suitable beam configuration, of radiation 110 directed at a coating material (not shown) disposed on the substrate 106. The radiation 110 is selectively applied to a surface of the coating material to provide laser energy doze to discrete predetermined regions of the coating material. In one example, the radiation 110 may be selectively applied to the surface of the coating material as many times as needed until a desired change in the film properties, such as local stress or film density, present in the coating material is obtained. In another architecture, the laser may be reflected off a digital micromirror device, which then projects a laser pattern onto the substrate (enlarged to treat the whole substrate or in a small field which is scanned across the substrate) to build up the treatment dosage map as needed.

Lens 102 may be any suitable lens, or series of lenses, capable of focusing radiation into a line or spot. In one example, lens 102 is a cylindrical lens. Alternatively, lens 102 may be one or more concave lenses, convex lenses, plane mirrors, concave mirrors, convex mirrors, refractive lenses, diffractive lenses, Fresnel lenses, gradient index lenses, or the like.

A detector 116 is disposed in the laser module 152 above the stage 112. In one example, the detector 116 may be an optical detector may provide a light source 120 with different wavelengths to inspect and detect film properties of the coating material and/or the substrate 106 positioned on the stage 112. The light source 120 may be reflected from the substrate 106 or the coating material disposed thereon, forming a reflected light beam 122 back to the detector 116 for in-time feedback control. In one example, the detector 116 and light source 120 may form part of an optical microscope (OM) that may be used to view individual device die pattern or features formed in the coating material on the substrate 106. In another example, the detector 116 may be a metrology tool or a sensor capable of detecting local thickness, stress, refractive index (n&k), surface roughness, film density or resistivity on the material layer and/or the substrate 106 prior to performing a laser energy process. In yet another example, the detector 116 may include a camera that may capture images of the coating material and/or the substrate 106 so as to analyze the coating material and/or the substrate 106 based on the image color contrast, image brightness contrast, image comparison and the like. In another example, the detector 116 may be any suitable detector that may detect different film properties or characteristics, such as stress, surface roughness, film density, of the substrate or the film layers disposed on the substrate.

The detector 116 may linearly scan the substrate surface across a linear region of the coating material. The detector 116 may also help to identify the coordinate, alignment, or orientation of the substrate 106. The detector 116 may scan the substrate 106 as the substrate 106 advances in an X-direction 170. Similarly, the detector 116 may scan the substrate 106 as the substrate 106 moves in a Y-direction 180 as the translation mechanism 124 moves the stage 112. The detector 116 may be coupled to a controller 190, so as to control movement and data transfer from the detector 116 or other detectors or computing system to the laser module 152.

The controller 190 may be a high speed computer configured to control the detector 116 and/or the laser module 152 to perform an optical detection process and/or a laser energy treatment process. In one example, the optical detection process is performed by the detector 116 prior to the laser energy treatment process, so that the process parameters set in a laser energy treatment recipe for performing a laser energy process may be based on the measurement data received from the optical detection process. In one example, the controller 190 may be further coupled to a data computing system (not shown) to obtain data or computed algorithm from the data computing system so as to assist determining a proper recipe to perform the laser energy treatment process on the coating material on the substrate 106.

In one example, the translation mechanism 124 may be configured to translate the stage 112 and the radiation 110 relative to one another. The translation mechanism 124 may be configured to move the stage 112 in positive and negative X-direction 170 and positive and negative Y-direction 180. In one example, the translation mechanism 124 coupled to the stage 112 is adapted to move the stage 112 relative to the laser module 152 and/or the detector 116. In another example, the translation mechanism 124 is coupled to the laser module 152 and/or the focusing optical module 104 and/or the detector 116 to move the laser radiation source 101, the focusing optical module 104, and/or the detector 116 to cause the beam of energy to move relative to the substrate 106 that is disposed on the stage 112. In yet another example, the translation mechanism 124 moves the laser radiation source 101 and/or the focusing optical module 104, the detector 116, and the stage 112. Any suitable translation mechanism may be used, such as a conveyor system, rack and pinion system, or an x/y actuator, a multiple robot, or other suitable mechanical or electro-mechanical mechanism to use for the translation mechanism 124. Alternatively, the stage 112 may be configured to be stationary, while a plurality of galvanometric heads (not shown) may be disposed around the substrate edge to direct radiation from the laser radiation source 101 to the substrate as needed.

The translation mechanism 124 may be coupled to the controller 190 to control the scan speed at which the stage 112 and the laser radiation source 101 move relative to one another. In one example, the laser radiation source 101 is an optical radiation source. The controller 190 may receive data from the detector 116 or from the data computing system to generate an optimized laser energy recipe that is used to control the laser module 152 to perform an optimized laser dose patterning process. The stage 112 and the radiation 110 and/or the laser radiation source 101 are moved relative to one another so that energy is delivered to discrete desired regions of the coating material. In one example, the translation mechanism 124 moves at a constant speed. In another example, the translation of the stage 112 and movement of the line of radiation 110 follow different paths that are controlled by the controller 190.

Figure 2:
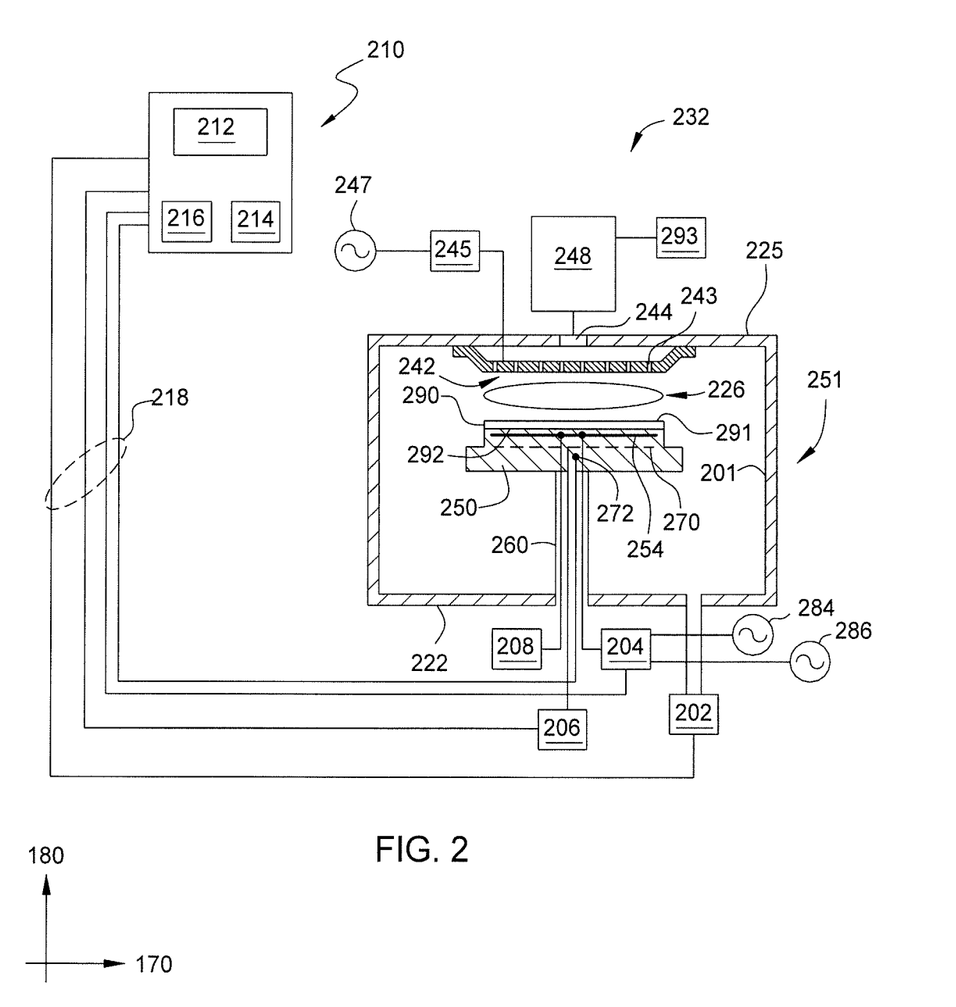
FIG. 2 is a schematic diagram of a plasma reactor having at least one chamber component made in the processing tool of FIG. 1.

FIG. 2 is a cross sectional view of the processing chamber 232 suitable for performing a plasma deposition process (e.g., a plasma enhanced CVD or a metal organic CVD) where a part (e.g., a chamber component) may be utilized therein. The processing chamber 232 may be a suitably adapted CENTURA®, PRODUCER® SE or PRODUCER® GT or PRODUCER® XP processing system available from Applied Materials, Inc., of Santa Clara, Calif. It is contemplated that other processing systems, including those produced by other manufacturers, may benefit from examples described herein.

The processing chamber 232 includes a chamber body 251. The chamber body 251 includes a lid 225, a sidewall 201 and a bottom wall 222 that define an interior volume 226.

A pedestal 250 is provided in the interior volume 226 of the chamber body 251. The pedestal 250 may be fabricated from aluminum, ceramic, aluminum nitride, and other suitable materials. In one example, the pedestal 250 is fabricated by a ceramic material, such as aluminum nitride, which is a material suitable for use in a high temperature environment, such as a plasma process environment, without causing thermal damage to the pedestal 250. The pedestal 250 may be moved in the Y-direction 180 inside the chamber body 251 using a lift mechanism (not shown). The pedestal 250 is supported by a shaft 260. The shaft 260 has a hollow center through which wiring is passed. The wiring couples circuits to electrodes disposed within the pedestal 250.

The pedestal 250 may include an embedded heater element 270 suitable for controlling the temperature of a substrate 290 supported on the pedestal 250. In one example, the pedestal 250 may be resistively heated by applying an electric current from a power supply 206 to the heater element 270. In one example, the heater element 270 may be made of a nickel-chromium wire encapsulated in a nickel-iron-chromium alloy (e.g., INCOLOY®) sheath tube. The electric current supplied from the power supply 206 is regulated by a controller 210 to control the heat generated by the heater element 270, thus maintaining the substrate 290 and the pedestal 250 at a substantially constant temperature during film deposition at any suitable temperature range. In another example, the pedestal 250 may be maintained at room temperature as needed. In yet another example, the pedestal 250 may also include a chiller (not shown) as needed to cool the pedestal 250 at a range lower than room temperature as needed. The supplied electric current may be adjusted to selectively control the temperature of the pedestal 250 between about 100 degrees Celsius to about 700 degrees Celsius.

A temperature sensor 272, such as a thermocouple, may be embedded in the pedestal 250 to monitor the temperature of the pedestal 250 in a conventional manner. The measured temperature is used by the controller 210 to control the power supplied to the heater element 270 to maintain the substrate at a desired temperature.

The pedestal 250 can include a plurality of lift pins (not shown) disposed therethrough that are configured to lift the substrate 290 from the pedestal 250 and facilitate exchange of the substrate 290 with a robot (not shown) in a conventional manner.

The pedestal 250 includes at least one electrode 292 for retaining the substrate 290 on the pedestal 250. The electrode 292 is driven by a chucking power source 208 to develop an electrostatic force that holds the substrate 290 to the pedestal surface, as is conventionally known. Alternatively, the substrate 290 may be retained to the pedestal 250 by clamping, vacuum or gravity.

In one example, the pedestal 250 is configured as a cathode having the electrode 292 embedded therein, coupled to at least one RF bias power source, shown in FIG. 2 as two RF bias power sources 284, 286. Although the example depicted in FIG. 2 shows two RF bias power sources, 284, 286. It is noted that the number of the RF bias power sources 284, 286 may be any number as needed. The RF bias power sources 284, 286 are coupled between the electrode 292 disposed in the pedestal 250 and another electrode, such as a gas distribution plate 242 or lid 225 of the processing chamber 232. The RF bias power source 284, 286 excites and sustains a plasma discharge formed from the gases disposed in the processing region of the processing chamber 232.

In the example depicted in FIG. 2, the dual RF bias power sources 284, 286 are coupled to the electrode 292 disposed in the pedestal 250 through a matching circuit 204. The signal generated by the RF bias power source 284, 286 is delivered through matching circuit 204 to the pedestal 250 through a single feed to ionize the gas mixture provided in the processing chamber 232, thus providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts. The chucking power source 208 and the matching circuit 204 are coupled to an upper electrode 254. The upper electrode 254 is configured to electrostatically chuck a substrate 290 to the top surface 292 of the pedestal 250.

A vacuum pump 202 is coupled to a port formed in the bottom wall 222 of the chamber body 251. The vacuum pump 202 is used to maintain a desired gas pressure in the chamber body 251. The vacuum pump 202 also evacuates post-processing gases and by-products of the process from the chamber body 251.

The processing chamber 232 includes one or more gas delivery passages 244 coupled through the lid 225 of the processing chamber 232. The gas delivery passages 244 and the vacuum pump 202 are positioned at opposite ends of the processing chamber 232 to induce laminar flow within the interior volume 226 to minimize particulate contamination.

The gas delivery passages 244 are coupled to a gas panel 293 through a remote plasma source (RPS) 248 to provide a gas mixture into the interior volume 226. In one example, the gas mixture supplied through the gas delivery passages 244 may be further delivered through a gas distribution plate 242 disposed below the gas delivery passages 244. In one example, the gas distribution plate 242 having a plurality of apertures 243 is coupled to the lid 225 of the chamber body 251 above the pedestal 250. The apertures 243 of the gas distribution plate 242 are utilized to introduce process gases from the gas panel 293 into the chamber body 251. The apertures 243 may have different sizes, number, distributions, shape, design, and diameters to facilitate the flow of the various process gases for different process requirements. A plasma is formed from the process gas mixture exiting the gas distribution plate 242 to enhance thermal decomposition of the process gases resulting in the deposition of material on a surface 291 of the substrate 290.

The gas distribution plate 242 and the pedestal 250 may be formed a pair of spaced apart electrodes in the interior volume 226. One or more RF sources 247 provide a bias potential through a matching network 245 to the gas distribution plate 242 to facilitate generation of a plasma between the gas distribution plate 242 and the pedestal 250. Alternatively, the RF sources 247 and matching network 245 may be coupled to the gas distribution plate 242, pedestal 250, or coupled to both the gas distribution plate 242 and the pedestal 250. In one example, the RF sources 247 and matching network 245 may be coupled to an antenna (not shown) disposed exterior to the chamber body 251. In one example, the RF sources 247 may provide between about 10 Watts and about 3000 Watts at a frequency of about 30 kHz to about 13.6 MHz. Alternatively, the RF source 247 may be a microwave generator that provide microwave power to the gas distribution plate 242 that assists generation of the plasma in the interior volume 226.

Examples of gases that may be supplied from the gas panel 293 may include a silicon containing gas, fluorine continuing gas, oxygen containing gas, hydrogen containing gas inert gas and carrier gases. Suitable examples of the reacting gases includes a silicon containing gas, such as $SiH_4$, $Si_2H_6$, $SiF_4$, $SiH_2Cl_2$, $Si_4H_{10}$, $Si_5H_{12}$, TEOS and the like. Suitable carrier gas includes nitrogen ($N_2$), argon (Ar), hydrogen ($H_2$), alkanes, alkenes, helium (He), oxygen ($O_2$), ozone ($O_3$), water vapor ($H_2O$), and the like.

In one example, the remote plasma source (RPS) 248 may be alternatively coupled to the gas delivery passages 244 to assist in forming a plasma from the gases supplied from the gas panel 293 into the in the interior volume 226. The remote plasma source 248 provides plasma formed from the gas mixture provided by the gas panel 293 to the processing chamber 232.

The controller 210 includes a central processing unit (CPU) 212, a memory 216, and a support circuit 214 utilized to control the process sequence and regulate the gas flows from the gas panel 293. The CPU 212 may be of any form of a general purpose computer processor that may be used in an industrial setting. The software routines can be stored in the memory 216, such as random access memory, read only memory, floppy, or hard disk drive, or other form of digital storage. The support circuit 214 is conventionally coupled to the CPU 212 and may include cache, clock circuits, input/output systems, power supplies, and the like. Bi-directional communications between the controller 210 and the various components of the processing chamber 232 are handled through numerous signal cables collectively referred to as signal buses 218, some of which are illustrated in FIG. 2.

It is noted that all of the above described chamber components, such as the gas distribution plate 242, or pedestal 250, may have a coating material fabricated by the method described below to enhance the surface protection and chemical/plasma resistance.

Figure 3:
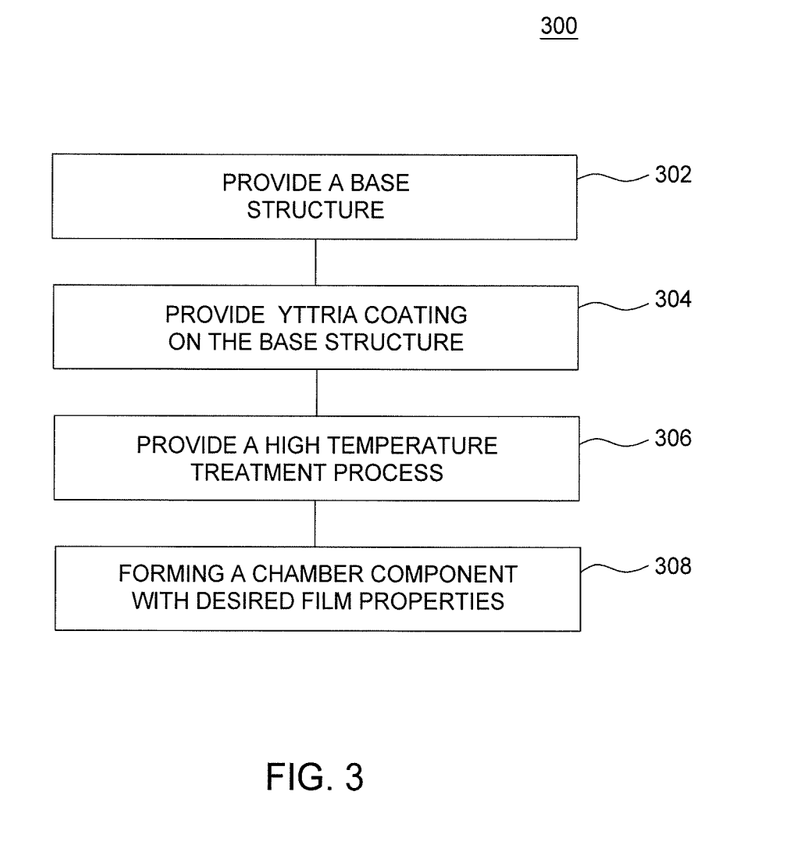
FIG. 3 is a method for manufacturing a coating on a chamber component utilizing the tool of FIG. 1.
Figure 4A:
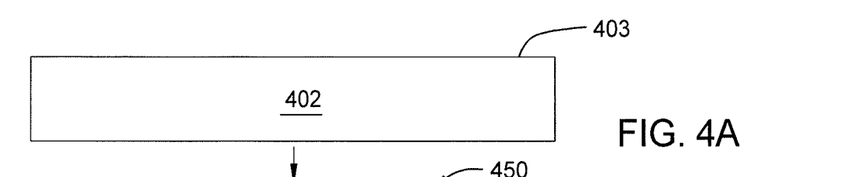
FIGS. 4A-4C are schematic illustrations of cross sectional views of the coating formed on the chamber component.

FIG. 3 illustrates one example of a method 300 that can be used to fabricate a coating material including a yttrium containing material (yttrium oxide ($Y_2O_3$) or $Y_xO_yF_z$ with metal dopants, such as Al or Zr) on a base structure, such as a part or a processing chamber 232 component. Suitable examples of the yttrium containing material include yttrium oxide or fluorine yttrium oxide, fluorine yttrium oxide with metal dopants (AlYOF or ZrYOF). The base structure includes an aluminum containing material. The method 300 starts at operation 302 by providing a base structure, such as the base structure 402 depicted in FIG. 4A, into a spray coating chamber (not shown). In one example, the base structure 402 may be a ceramic material, a metal dielectric material, such as $Al_2O_3$, AlN, AlON, bulk yttrium, suitable rare earth containing materials and the like. In one example, the base structure 402 is made from $Al_2O_3$ that allows a coating structure to be formed thereon.

Figure 4B:
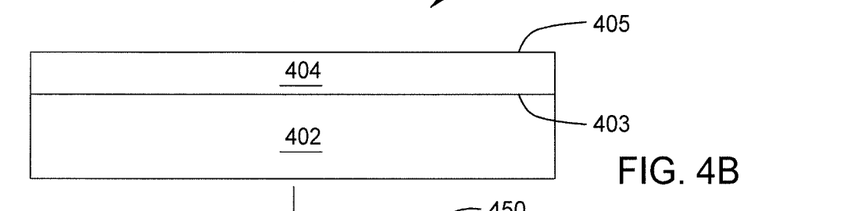

At operation 304, a spraying coating deposition process is performed to form a coating layer 404 on a first surface 403 of the base structure 402, as shown in FIG. 4B. The coating layer 404 includes a yttrium containing material (yttrium oxide ($Y_2O_3$) or $Y_xO_yF_z$ with metal dopants, such as Al or Zr). It is noted that any suitable coating chamber, such as liquid spray coating, gel spraying coating, plasma spray coating or other suitable deposition coating chambers may be utilized to coat a coating layer 404 that includes yttria onto the base structure 402.

In one example, the yttrium containing material (yttrium oxide ($Y_2O_3$) or $Y_xO_yF_z$ with metal dopants, such as Al or Zr) in powder form may be used as the starting material, and a slurry is formed by adding other components such as water, binder, and suitable additives that may be used to facilitate the fabrication process of the coating layer 404. The slurry may be then sprayed onto the first surface 403 of the base structure 402 to form the coating layer 404. A plasma may be generated to assist spraying the slurry onto the first surface 403 uniformly across the base structure 402, assisting coating the coating layer 404 on the base structure 402. In one example, the yttria powder may have an average particle size of between about 15 µm and about 0.1 µm. Yttria powder having smaller particle size may assist providing a relatively smoother surface of the coating layer 404, such as less substrate roughness as needed. In one example, the first coating layer is plasma sprayed coating on the base structure 402.

Figure 4C:
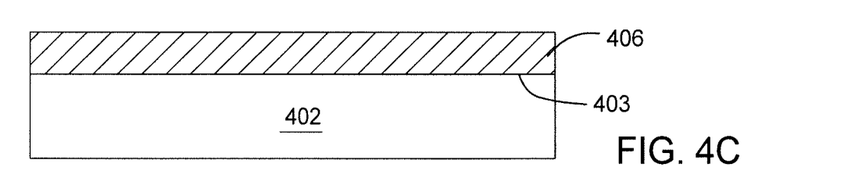

At operation 306, after the coating layer 404 is formed, a high temperature treatment (HIT) process is performed, forming a treated layer 406 on a second surface 405 of the coating layer 404, as shown in FIG. 4C. The high temperature treatment (HIT) process may be performed in the processing tool 100 depicted in FIG. 1. The high temperature treatment (HTT) process treats the surface of the coating layer 404 to alter the substrate surface properties. The bonding structures and the film properties of the coating layer 404 when treated at operation 304 yields a robust film structure (e.g., the treated layer 406) having low defect density in the treated layer 406. Furthermore, the high temperature treatment (HTT) process may assist removing contaminants from the surface of the coating layer 404, thus providing a good contact interface as well as avoiding particle accumulation on the coating layer 404. Furthermore, the high temperature treatment (HTT) process may also be performed to modify the morphology and/or surface roughness of the surface of the coating layer 404, forming the treated layer 406 with a relatively smoother surface, compared to the coating layer 404, so as to improve the adhesion of the subsequently deposited layers formed thereon as needed. In some examples, the high temperature treatment (HTT) process may or may not incorporate certain elements, such as oxygen or nitrogen, if needed, to react with the unsaturated bonds, loose bonds or dangling bonds from the coating layer 404 so as to improve the bonding energy and the bonding structures of the coating layer 404.

In one example, the high temperature treatment (HTT) process at operation 306 may be performed with or without an ambient gas in a processing chamber, such as the processing tool 100 depicted in FIG. 1.

In one example, the high temperature treatment (HTT) process is performed by applying a series of laser pulses to discrete areas of the coating layer 404 according to the specific location requirements identified by high temperature treatment (HTT) process requirement. The bursts of laser pulses may have a laser of wavelength greater than 193 nm, for example between about 248 nm and about 10,000 nm, for example about 1,100 nm. Each pulse is focused to predetermined regions of the coating layer 404 to be treated.

In one example, the spot size of the laser pulse is controlled at between about 10 µm and about 1000 µm. The spot size of the laser pulse may be configured in a manner to alter film property at certain locations of the film layer with desired dimension, feature, pattern, and geometries.

The laser pulse may have energy density (e.g., fluence) between about 1 microJoules per square centimeter ($\mu J/cm^2$) and about 2 microJoules per square centimeter ($\mu J/cm^2$) at a frequency between about 1 kHz and about 20 MHz. Each laser pulse length is configured to have a duration of about 10 micro-seconds up to 10 femto-seconds. During the laser treatment process, the base structure temperature may be maintained at between about 15 degrees Celsius and about 75 degrees Celsius.

The laser pulse changes the local stress of the film layer without annealing or otherwise heat treating the coating layer 404 to form the treated layer 406 with desired surface roughness. A single laser pulse may be used or multiple laser doses applied to the same substrate location. After a first substrate location is laser treated, a second substrate location is then laser treated by positioning the laser pulse (or substrate) to direct the pulse to a second location. The high temperature treatment (HTT) process requirement is continued until a predetermined time period is reached.

In some examples, an ambient gas may be supplied in the enclosure 150 of the processing tool 100 while performing the high temperature treatment (HTT) process so that some of the elements from the ambient gas may be treated or incorporated into the treated layer 406 as needed. In one example, the ambient gas may be an oxygen containing gas, such as $O_2$, $N_2O$, $NO_2$, $H_2O_2$, $H_2O$ or $O_3$, a nitrogen containing gas, such as $N_2O$, $NH_3$, $NO_2$, $N_2$, or the like, or an inert gas, such as Ar and He.

In some examples, the amount of ambient gas supplied into the enclosure 150 may be varied and/or adjusted to accommodate, for example, the depth/thickness of the elements as incorporated to form the treated layer 406.

The laser energy treatment process may alter, release or eliminate localized residual stress in discrete regions of the coating layer 404, so as to locally change the in-plane strain in the film layer. By doing so, the local stress change of the coating layer 404 during the high temperature treatment process can also provide the resultant treated layer 406 with a relatively planar surface, so as to reduce surface roughness of the treated layer 406.

At operation 308, after the treatment process at operation 306, the base structure with a coating material 450 (the resultant treated layer 406 converted from the coating layer 404) formed thereon is formed with the desired film properties. In one example, the coating material 450 may have a surface roughness greater than Ra 5 micrometer. The density of the coating material 450 may be greater than 4.0 $g/cm^3$, such as between about 4.0 $g/cm^3$ and 5.2 $g/cm^3$. In the example wherein the yttrium containing material of the coating material 450 includes yttria. The yttria of the coating material 450 may have a yttrium to oxide (Y:O) ratio between about 1:1 and 2:1. The coating material 450 has a thickness between about 0.5 µm and about 50 µm. The coating material 450 has a pore density less than 2%.

As the coating material 450 formed on the base structure 402 has a relatively robust structure, upon depositing such coating material 450 on the chamber component in a processing chamber, such as the processing chamber 232 in FIG. 2, the coating material 450 may maintain a good surface condition while undergoing the attack of the aggressive plasma species during a plasma process. Thus, the likelihood of generating particles or contamination from a chamber wall, a substrate support, a gas distribution plate or other chamber components from the processing chamber 232 is reduced.

Figure 5:
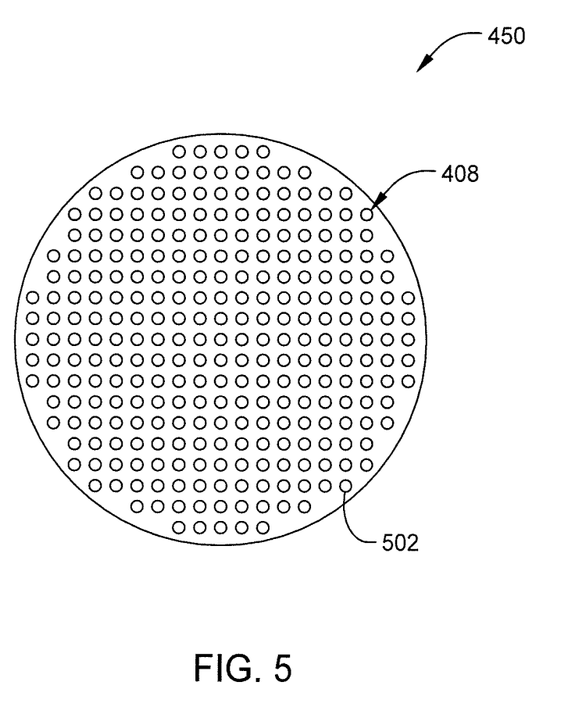
FIG. 5 depicts a bottom view of a chamber component used in the plasma etch reactor of FIG. 2 manufactured by the method of FIG. 3.

FIG. 5 depicts a schematic illustration of a bottom view of a gas distribution plate 242 that can be fabricated with the coating material 450 formed thereon according to examples of this disclosure. The yttria-coated gas distribution plate 242 can be used in the processing chamber 232 or other plasma chambers, such as those for etching or deposition applications, among others. The gas distribution plate 242 is provided with a plurality of apertures 243 to allow passage of process gases and/or plasma species into a process region of the processing chamber 232. The apertures 243 may be arranged in a regular pattern on the gas distribution plate 242, or they may be arranged in different patterns to allow for different gas distribution needs. In the example depicted in FIG. 5, the coating material 450 is formed on a bottom surface of the gas distribution plate 242 (the same as the gas distribution plate 242 shown in FIG. 2). The coating material 450 coated on a surface of the gas distribution plate 242 that can assist the gas distribution plate 242 from being attacked by the aggressive plasma species during a plasma process, thus reducing likelihood of generating particles or contamination falling on the substrate 290 positioned in the processing chamber 232. Thus, product yield and substrate 290 cleanliness may be enhanced and maintained.

Examples of this disclosure can be used to fabricate the coating material including yttria on a chamber part for a variety of applications. These enhanced surface coating chamber parts are suitable for use in corrosive environments such as those encountered in plasma processes. A variety of plasma deposition and etch chambers may benefit from the teachings disclosed herein, for example, dielectric etch chambers such as the ENABLER® etch chamber, which may be part of a semiconductor wafer processing system such as the CENTURA® system, a dielectric deposition chamber, such as the PRODUCER® or ENDURA® deposition chamber, which may be part of a semiconductor wafer processing system, the eMax etch chamber, the Producer etch chamber, as well as conductor etch chambers such as AdvantEdge Metal and the DPS Metal chambers, among others, all of which are available from Applied Materials, Inc. of Santa Clara, Calif. It is contemplated that other plasma reactors, including those from other manufacturers, may be adapted to benefit from the disclosure.

While the foregoing is directed to examples of the present disclosure, other and further examples of the disclosure may be devised without departing from the basic scope thereof, and the scope thereof is determined by the claims that follow.

The invention claimed is:

1. A method of fabricating a coating material, comprising:
providing a base structure comprising an aluminum containing material;
forming a coating layer comprising a yttrium containing material on the base structure; and
thermal treating the coating layer with a thermal source to form a treated coating layer, wherein the thermal source has an energy density between about 1 µJ/cm$^2$ and about 2 µJ/cm$^2$, and a frequency between about 1 kHz and about 20 MHz.

2. The method of claim 1, wherein the yttrium containing material is at least one of yttrium oxide or fluorine yttrium oxide, or fluorine yttrium oxide with metal dopants.

3. The method of claim 1, wherein thermal treating the coating layer comprises:
performing a laser treatment process on the coating layer.

4. The method of claim 3, wherein performing the laser treatment process comprises:
directing a light radiation from a laser module to a surface of the coating layer.

5. The method of claim 4, wherein the laser module provides the light radiation having a wavelength between about 187 nm and about 10000 nm.

6. The method of claim 4, wherein the laser module provides the light radiation having a wavelength between 248 nm and about 2100 nm.

7. The method of claim 1, wherein thermal treating the coating layer further comprises:
maintaining a base structure temperature at between about 15 degrees Celsius and about 75 degrees Celsius.

8. The method of claim 1, wherein the yttrium containing material is yttrium oxide.

9. The method of claim 1, wherein the treated coating layer has a film density greater than 4 g/cm$^3$.

10. The method of claim 1, wherein the treated coating layer has a thickness between about 0.5 µm and about 50 µm.

11. The method of claim 1, wherein the base structure is a gas distribution plate or a substrate support assembly in a processing chamber.

12. The method of claim 1, wherein the base structure is a chamber component utilized in a plasma processing chamber.

13. The method of claim 1, wherein the treated coating layer has a surface roughness greater than Ra 5 micrometer.

14. The method of claim 1, wherein the aluminum containing material of the base structure is Al$_2$O$_3$, AlN or a ceramic material.

15. The method of claim 1, wherein thermal treating the coating layer further comprises:
removing surface particles from the base structure.

16. A method of fabricating a coating material, comprising:
providing a base structure comprising an aluminum containing material;
forming a coating layer comprising a yttrium containing material on the base structure; and
laser treating the coating layer to form a treated coating layer, wherein the laser has an energy density between about 1 µJ/cm$^2$ and about 2 µJ/cm$^2$, and a frequency between about 1 kHz and about 20 MHz.

17. The method of claim 16, wherein the yttrium containing material is at least one of yttrium oxide, fluorine yttrium oxide, or fluorine yttrium oxide with metal dopants.

18. The method of claim 16, wherein the base structure is a gas distribution plate disposed in a plasma processing chamber.

19. A method of fabricating a coating material, comprising:
forming a coating layer comprising a yttrium containing material on a base structure, the base structure comprising an aluminum containing material; and
laser treating the coating layer to form a treated coating layer, the laser treating comprising:
applying a series of laser pulses to the coating layer, wherein each laser pulse of the series of laser pulses has an energy density within a range of about 1 µJ/cm$^2$ to about 2 µJ/cm$^2$, a frequency within a range of about 1 kHz to about 20 MHz, a wavelength within a range of about 248 nm to about 2100 nm, and a duration within a range of about 10 femto-seconds to about 10 micro-seconds, and
reacting a gas with the coating layer, the gas containing one or more of oxygen or nitrogen.

20. The method of claim 19, wherein the gas reacts with the coating layer while the series of laser pulses are applied to alter a bonding energy of the coating layer, and the treated coating layer has:
a density within a range of about 4.0 g/cm$^3$ to about 5.2 g/cm$^3$;
a yttrium to oxide (Y:O) ratio within a range of about 1:1 to about 2:1;
a thickness within a range of about 0.5 µm to about 50 µm; and
a pore density less than 2%.

* * * * *